United States Patent
Duisters et al.

(10) Patent No.: US 7,184,123 B2
(45) Date of Patent: Feb. 27, 2007

(54) LITHOGRAPHIC OPTICAL SYSTEM

(75) Inventors: Johannes Martinus Duisters, Budel-Schoot (NL); Johannes Adrianus Antonius Theodorus Dams, Veldhoven (NL); Wilfred Edward Endendijk, Steensel (NL)

(73) Assignee: ASML Netherlands B.V., Veldhoven (NL)

( * ) Notice: Subject to any disclaimer, the term of this patent is extended or adjusted under 35 U.S.C. 154(b) by 160 days.

(21) Appl. No.: 10/807,408

(22) Filed: Mar. 24, 2004

(65) Prior Publication Data

US 2005/0213060 A1    Sep. 29, 2005

(51) Int. Cl.
G03B 27/42    (2006.01)
G03B 27/54    (2006.01)

(52) U.S. Cl. .......................................... 355/67; 355/53

(58) Field of Classification Search ................. 355/67, 355/53, 77, 30, 55
See application file for complete search history.

(56) References Cited

U.S. PATENT DOCUMENTS

| | | | |
|---|---|---|---|
| 4,907,021 A * | 3/1990 | Yabu ........................... 353/101 |
| 5,229,872 A | 7/1993 | Mumola |
| 5,296,891 A | 3/1994 | Vogt et al. |
| 5,425,045 A * | 6/1995 | Hamatani ................... 372/101 |
| 5,523,193 A | 6/1996 | Nelson |
| 5,602,683 A * | 2/1997 | Straaijer et al. ............. 359/811 |
| 5,969,441 A | 10/1999 | Loopstra et al. |
| 6,046,792 A | 4/2000 | Van Der Werf et al. |
| 6,252,648 B1 * | 6/2001 | Hase et al. ..................... 355/53 |
| 6,288,769 B1 * | 9/2001 | Akagawa et al. .............. 355/30 |
| 6,341,006 B1 * | 1/2002 | Murayama et al. ........... 355/53 |
| 6,633,364 B2 * | 10/2003 | Hayashi ........................ 355/53 |
| 6,714,277 B2 * | 3/2004 | Hara et al. ..................... 355/30 |
| 6,825,914 B2 * | 11/2004 | Schroeder et al. ............. 355/30 |
| 6,842,221 B1 * | 1/2005 | Shiraishi ....................... 355/30 |
| 2002/0008863 A1 * | 1/2002 | Taniguchi et al. ............. 355/55 |
| 2002/0012109 A1 * | 1/2002 | Suzuki et al. .................. 355/53 |
| 2005/0199598 A1 * | 9/2005 | Hunter et al. ........... 219/121.72 |
| 2006/0165406 A1 * | 7/2006 | Makii ........................... 396/349 |

FOREIGN PATENT DOCUMENTS

WO    98/40791    9/1998

* cited by examiner

*Primary Examiner*—Rodney Fuller
(74) *Attorney, Agent, or Firm*—Pillsbury Winthrop Shaw Pittman LLP

(57) ABSTRACT

A lithographic optical system is presented herein. The optical system comprises a housing with two optically transparent windows and at least one moveable lens therein, as well as at least one other optical element outside said housing. By providing at least one optical element outside the housing, possible deleterious influences thereof on the optical quality of the moveable lens may be diminished. The housing with the moveable lens may be purged, and may be provided with a linear motor and a gas bearing for contactless moving of the lens.

30 Claims, 7 Drawing Sheets

LITHOGRAPHIC OPTICAL SYSTEM

BACKGROUND OF THE INVENTION

1. Field of the Invention

The present invention relates to an optical system for a lithographic apparatus, and to a lithographic projection apparatus employing such an optical system

2. Description of the Related Art

Lithographic apparatus can be used, for example, in the manufacture of integrated circuits (ICs). In such a case, a patterning device may be used to generate a desired circuit pattern corresponding to an individual layer of the IC, and this pattern can be imaged onto a target portion (e.g. comprising one or more dies) on a substrate (silicon wafer) that has been coated with a layer of radiation-sensitive material (resist).

Generally, such apparatus include an illumination system for supplying a projection beam of radiation, a support structure for supporting the patterning device, a substrate holder for holding a substrate, and a projection system for projecting the patterned beam onto a target portion of the substrate. More information with regard to lithographic devices as here described can be gleaned, for example, from U.S. Pat. No. 6,046,792, incorporated herein by reference.

The term "patterning device" as employed herein should be broadly interpreted as referring to a mechanism that can be used to endow an incoming radiation beam with a patterned cross-section, corresponding to a pattern that is to be created in a target portion of the substrate; the term "light valve" can also be used in this context. Generally, the pattern will correspond to a particular functional layer in a device being created in the target portion, such as an integrated circuit or other device (see below). Examples of such a patterning device include:

mask: the concept of a mask is well known in lithography, and it includes mask types such as binary, alternating phase-shift, and attenuated phase-shift, as well as various hybrid mask types. Placement of such a mask in the radiation beam causes selective transmission (in the case of a transmissive mask) or reflection (in the case of a reflective mask) of the radiation impinging on the mask, according to the pattern on the mask. In the case of a mask, the support structure will generally be a mask table, which ensures that the mask can be held at a desired position in the incoming radiation beam, and that it can be moved relative to the beam if so desired;

programmable mirror array: an example of such a device is a matrix-addressable surface having a visco-elastic control layer and a reflective surface. The basic principle behind such an apparatus is that (for example) addressed areas of the reflective surface reflect incident light as diffracted light, whereas unaddressed areas reflect incident light as undiffracted light. Using an appropriate filter, the said undiffracted light can be filtered out of the reflected beam, leaving only the diffracted light behind; in this manner, the beam becomes patterned according to the addressing pattern of the matrix-addressable surface. The required matrix addressing can be performed using suitable electronic means. More information on such mirror arrays can be gleaned, for example, from U.S. Pat. Nos. 5,296,891 and 5,523,193, which are incorporated herein by reference. In the case of a programmable mirror array, the said support structure may be embodied as a frame or table, for example, which may be fixed or movable as required; and programmable LCD array: an example of such a construction is given in U.S. Pat. No. 5,229,872, which is incorporated herein by reference. As above, the support structure in this case may be embodied as a frame or table, for example, which may be fixed or movable as required.

For purposes of simplicity, the rest of this text may, at certain location point points, specifically direct itself to examples involving a mask and mask table; however, the general principles discussed in such instances should be seen in the broader context of the patterning device as set forth above.

In general, a single wafer will contain a whole network of adjacent target portions that are successively irradiated via the projection system, one at a time. In current apparatus, employing patterning by a mask on a mask table, a distinction can be made between two different types of machine. In one type of lithographic apparatus 13 commonly referred to as a wafer stepper 13 each target portion is irradiated by exposing the entire mask pattern onto the target portion in one go. In an alternative apparatus 13 commonly referred to as a step-and-scan apparatus 13 each target portion is irradiated by progressively scanning the mask pattern under the projection beam in a given reference direction (the "scanning" direction) while synchronously scanning the substrate table parallel or anti-parallel to this direction. Because, typically, the projection system will have a magnification factor M (generally<1), the speed V at which the substrate table is scanned will be a factor M times that at which the mask table is scanned. More information with regard to lithographic devices as here described can be gleaned, for example, from U.S. Pat. No. 6,046,792, incorporated herein by reference.

In a manufacturing process using a lithographic apparatus, the pattern is imaged onto a substrate that is at least partially covered by a layer of radiation-sensitive material (resist). Prior to this imaging step, the substrate may undergo various procedures, such as priming, resist coating and a soft bake. After exposure, the substrate may be subjected to other procedures, such as a post-exposure bake (PEB), development, a hard bake and measurement/inspection of the imaged features. This array of procedures is used as a basis to pattern an individual layer of a device, e.g. an IC. Such a patterned layer may then undergo various processes such as etching, ion-implantation (doping), metallization, oxidation, chemo-mechanical polishing, etc., all intended to finish off an individual layer.

If several layers are required, then the whole procedure, or a variant thereof, will have to be repeated for each new layer. Eventually, an array of devices will be present on the substrate (wafer). These devices are then separated from one another by a technique such as dicing or sawing, whence the individual devices can be mounted on a carrier, connected to pins, etc. Further information regarding such processes can be obtained, for example, from the book "Microchip Fabrication: A Practical Guide to Semiconductor Processing", Third Edition, by Peter van Zant, McGraw Hill Publishing Co., 1997, ISBN 0-07-067250-4, incorporated herein by reference.

For the sake of simplicity, the projection system may hereinafter be referred to as the "lens"; however, this term should be broadly interpreted as encompassing various types of projection system, including refractive optics, reflective optics, and catadioptric systems, for example. The radiation system may also include components operating according to any of these design types for directing, shaping or controlling the projection beam of radiation, and such components may also be referred to below, collectively or singularly, as a "lens". Further, the lithographic apparatus may be of a type having two or more substrate tables (and/or two or more mask tables). In such "multiple stage" devices the additional tables may be used in parallel, or preparatory steps may be carried out on one or more tables while one or more other tables are being used for exposures. Twin stage lithographic apparatus are described, for example, in U.S. Pat. No. 5,969,441 and WO 98/40791, incorporated herein by reference.

Further, the lithographic apparatus may be of a type having two or more substrate tables (and/or two or more mask tables). In such "multiple stage" devices the additional tables may be used in parallel, or preparatory steps may be carried out on one or more tables while one or more other tables are being used for exposures. Dual stage lithographic apparatus are described, for example, in U.S. Pat. No. 5,969,441 and WO 98/40791, both incorporated herein by reference.

As indicated above, one of the objectives of lithographic processes is to provide a substrate with a desired complex pattern, e.g. to manufacture transistor for other semiconductor devices. One of the techniques mostly used to impart such a pattern to the substrate employs optical radiation and an optical system to control this optical radiation. In the context of this application, the term optical relates to electromagnetic radiation, especially with a wavelength between about 100 nm and about 700 nm.

The demand for optical systems used in lithography are very strict, e.g. in order to be able to provide structures with very small dimensions, and with a high degree of precision. Herein, it is not only demanding to provide an optical system with such high quality, but it is also desirable to be able to maintain such high quality during use of the optical system.

SUMMARY OF THE INVENTION

Typically, conventional illumination systems include an enclosed housing with a laser light source, a gas purging system, and a large number of components, such as filters, and optical elements, such as mirrors, blinds etc. However, by enclosing such a large number of optical elements (generally all optical elements of the optical system) in one housing, there is a strong chance that issues with respect to one of optical element will affect at least one other optical element. For example, it is possible that one or more optical elements include a part that outgasses, which may deteriorate the quality of other optical elements, such as, by depositing gas on surfaces of the optical elements, such as a lens, mirror etc., or by a reaction with such a surface. In particular lenses, such as a movable lens or a zoom lens, are sensitive to such influences.

The principles of the present invention, as embodied and broadly described herein, provide a lithographic optical system having a configuration where it is possible to maintain a good quality of an optical element included therein. In one embodiment, the lithographic optical system comprises a first housing including a first chamber, a first optically transmissive window, a second optically transmissive window, and at least one moveable lens positioned inside said first chamber. The optical system further comprises at least one gas exchange opening in communication with the first chamber and at least one additional optical element positioned outside the first opening, wherein an optical path is defined by the first optically transmissive window, the second optically transmissive window, the at least one moveable lens, and the at least one additional optical element.

By providing at least one additional optical element outside the first housing, the additional optical element does not influence the at least one moveable lens in the first chamber. Any gas or other material emitted by the additional optical element can no longer reach the at least one moveable lens. Note that one or more of the additional elements may also be provided in one or more additional housings.

In particular, the optical system is constructed and arranged for receiving radiation and converting the radiation into a projection beam of radiation for illuminating a patterning device. Alternatively, the optical system is constructed and arranged for receiving a patterned beam of radiation and for projecting the patterned beam of radiation onto a substrate. It is to be understood that in the former case, optical system relates to parts in the optical path before the patterning device, while in the latter case, the optical system relates to the parts between a patterning device and a substrate. The terms "patterning device" and "substrate" will be elucidated below. What matters is that possibly disturbing or polluting elements have been taken out of the space that contains the moveable lens.

Advantageously, the at least one additional optical element is one of a blind, a filter, a mirror, and a lens. These additional optical elements are commonly used in an optical system. Yet, other types of optical elements are not excluded. In the present application, a blind is considered to be a device for changing the shape of an optical beam that is to be transmitted or emitted by the optical system according to the invention, and may comprise one or more stationary or moveable non-transmissive blades. A filter maybe any device that is transmissive for at least part of radiation striking the filter, while mirror and lens have their usual meaning.

In particular, an advantageous embodiment of the optical system according to the invention comprises a plurality of additional optical elements outside the first housing. This embodiment is particularly advantageous when a relatively large number of optical elements of the total optical system are provided outside the first housing. The more optical elements are taken out of the first chamber, the first housing respectively, the smaller the change of their influencing the at least one moveable lens.

Advantageously, the moveable lens is a composite lens comprising a plurality of lens elements, at least one of which is moveable in the first chamber. In particular, the moveable lens is a zoom lens. Alternatively, the moveable lens is a simple lens. It would then e.g. be possible to embody at least one optically transmissive window as a lens, thereby obtaining a zoom function for the combined window and moveable lens. Nevertheless, in most cases the moveable lens will be a composite lens, wherein at least one lens element is moveable either with respect to the first housing or with respect to at least one other lens element. Such a zoom lens is a fundamental part of an optical system in a lithographic projection apparatus. It not only determines a magnification factor but may also affect the homogeneity of the image, the precision of the image in terms of resolving power, distortion, etc. This ensures the best possible environment for the at least one moveable lens in the first chamber.

Therefore, an advantageous embodiment is characterized in that only the at least one moveable lens is a moveable part in the first chamber. By ensuring that the at least one moveable lens is the only moveable part in the first chamber, possible sources of pollution are excluded. Note that any moveable part may give rise to pollution as caused by small particles released in the chamber due to friction etc. Alternatively, moveable parts make use of lubricants, which may give rise to additional small particles or evaporating lubricants being released in the chamber. By providing only the at least one moveable lens as a moveable part in the first chamber, at least the number of the moveable parts is reduced to a minimum.

More advantageously, the at least one moveable lens is the only optical element in the first chamber. A most preferable embodiment has only the at least one moveable lens in the first chamber. A further reduction of optical elements inside the chamber does not seem practicable. The number of sources of possible pollution is thus minimized.

Even in a clean environment, it will not always to be possible to prevent pollution from entering the space inside the first housing, the first chamber. Therefore, advantageously, the optical system further comprises first gas exchange means connected to the at least one gas exchange opening. Such gas exchange means may provide that the chamber is either purged with a gas, or gas is removed from the first chamber. Also, much or all of possible pollutants introduced in the first chamber may be removed from the first chamber by exchanging the gas therein, or removing gas therefrom. In many cases this reduces the possibilities of pollutants to attack delicate materials or coatings. Note that simple depositing of e.g. dust particles, without chemically reacting would also deteriorate the optical quality. Removing such particles, etc., with the first gas exchange means also helps to improve or maintain the optical quality.

Advantageously, the first gas exchange means comprises at least one of a pump and a container with a gas. A pump connected to the at least one gas exchange opening may be used to remove gas, possibly with small particles therein, from the first chamber. The pump may also be used to purge or flush the first chamber, e.g. by first pumping a gas into the chamber, and subsequently removing the gas by reversing the pump action. Alternatively, the first chamber may be connected to a container with pressurized gas. Either the internal gas pressure of the first chamber is increased above atmospheric level, such that after removal of the container access gas will escape from the first chamber. It may also be possible to provide the first chamber with at least a second gas exchange opening. In that case, connecting a container with a pressurized gas may ensure that gas which is forced into the first chamber by means of an overpressure in the container will escape through the at least one second gas exchange opening. In effect, the first chamber is vented. Alternatively, the container may contain a gas with an underpressure. In that case, gas present in the first chamber may flow into the container. However, it is to be noted that any other method or device for exchanging gas is also possible in combination with the optical system according to the invention.

Advantageously, the at least one gas exchange opening is sealable. By having the at least one gas exchange opening sealable it is possible to provide a substantially gas-tight first housing. After having provided a desired environment in the first chamber, e.g. a purged gas environment or a vacuum environment, the at least one gas exchange opening may be sealed. An advantage may be that any vibrations etc. caused by a pump or the like, as well as any possible movements of gas in the first chamber may thus be avoided. This is advantageous for improving the optical imaging quality of the optical system. Nevertheless, it is also possible to keep at least one gas change opening open, in order to have a continuous or intermittent gas exchange.

Advantageously, and in particular in view of the embodiment with permanent gas exchange, the at least one gas exchange opening comprises a gas supply opening and a gas exhaust opening. By providing a gas supply opening and a gas exhaust opening it is possible to set up a gas exchange circuit, allowing permanent, or intermittent, gas exchange. This in turn allows a continuous control over the condition of the gas environment in the chamber. Note that it is also possible to provide a plurality of gas supply openings and/or gas exhaust openings. This may be advantageous in order to reduce turbulence, gas speed etc.

Advantageously, a gas bearing is provided for the moveable lens. A gas bearing may be embodied as a contactless bearing for the moveable lens. This allows movement of the moveable lens without friction with an other mechanical part, thereby reducing the release of small particles due to abrasive friction. Nevertheless, if desired or necessary, other types of bearings may be provided, such as slide or sleeve bearings, e.g. coated with Teflon®.

In particular, the gas bearing may be provided with a gas supply which is connected to the first gas exchange means. Alternatively, at least one gas exchange opening is provided in the gas bearing. An advantage of such embodiments is that gas which is used for purging the first chamber is also used for the gas bearing. This allows a reduction of the amount of gas used, and simplifies the construction of the optical system.

In an advantageous embodiment of the optical system, the moveable lens is connected to a gravity compensator comprising a piston which is moveable in a cylinder with pressurizable gas. Particularly in cases wherein the direction of movement of the moveable lens is non-horizontal, the force of gravity may exert influence on the position of the moveable lens. To prevent an unwanted displacement of the moveable lens, a gravity compensator may be provided. This may e.g. comprise a piston which is moveable in a cylinder with pressurizable gas. By ensuring that the force exerted by the piston on the moveable lens substantially cancels the effective force of gravity on the moveable lens, the influence is minimized. Furthermore, since thus the force needed to displace the moveable lens, or in fact any other pact connected to a gravity compensator, is much smaller, up to two orders of magnitude in well-adjusted compensators, the actuators may be made much smaller. This allows less material to be used, which means less outgassing and lower costs. A lower power for the actuator also means that heating up of the actuators, and also the environment with the optical parts. Hence there will be less thermal deformation. Note that it may be possible to ensure that any means for moving the moveable lens also ensures that the lens is not displaced by the gravitational force after positioning the moveable lens.

In the above gravity compensator, the cylinder may preferably be sealed with a radial gas bearing, e.g. at the position where the piston leaves the cylinder. Purging gas is ejected into a gap of about 10–15 μm between the moving parts. The ejected gas ensures that friction between the moving parts is minimized. As those parts may be made of metals such as steel, outgassing may be reduced to an absolute minimum. Alternatively, other sealing means such as O-rings may be used, although friction and outgassing may reduce their applicability.

An advantageous embodiment of the optical system according to the invention comprises at least one second housing, with a second chamber inside the second housing and with a third and fourth optically transmissive window and accommodating at least one of the at least one additional optical element in the second chamber. In this embodiment, there are provided at least two housings, each accommodating at least one additional optical element in its respective chamber. Note that, in the case where more than one second housing is provided, each second housing will have a chamber etc. An advantage of this embodiment is that at least one additional optical element may also be isolated from possibly deteriorating influences. This is particularly advantageous when at least one additional optical element in the second chamber is also sensitive to e.g. water, oxygen, etc. Note that it is possible and advantageous to provide different environments in the first chamber, second chamber etc.

Another advantage is that optical elements may be exchanged, checked, cleansed etc. without having to disturb other, possibly delicate optical elements. In other words, a modular set-up of the optical system allows to maintain a desired protective environment for sensitive parts. Note that, in principal, this advantage also holds for all optical systems according to the present invention, when for example an additional optical element outside the first housing is exchanged, etc. This holds in particular, if the optical system according to the invention is built into a larger housing, which may or may not be purged as well. Then the housing may be opened without a negative influence on sensitive optical elements.

Advantageously, the at least one second housing comprises at least one gas exchange opening in communication with the second chamber, more advantageously the at least one gas exchange opening is sealable, and even more advantageously the optical system further comprises second gas exchange means connected to the gas exchange opening. In principal, these measures relate to means for controlling or improving the gas atmosphere inside the second housing, i.e. in the second chamber. Not only all the advantages as described for the first chamber hold for the second chamber, but it is also possible to maintain different gas atmospheres, levels of purity, etc. in the various chambers. This is not only advantageous with respect to the composition of the gas atmosphere, desirable for different materials of optical elements that may be attacked by different substances, but it also offers the possibility to use purging gas of the highest purity, and hence the most costly, for only one or a selected number of chambers, while other chambers may be purged with less pure and less expensive gas, while if desired, even further optical elements are not purged at all.

Advantageously, the first housing is releasably connected to at least one second housing. By connecting the housings, it is possible to guarantee an optimum alignment between the housings. This may be advantageous to ensure that an optical path through the first housing and the second housing ensures optimum optical quality. Note that it is not necessary to position the first and second housing in a straight line. It may be possible to provide a mirror for deflecting a beam of radiation emitted by the first housing. This may for example be a 45° mirror, in order to provide a more compact set-up of the lithographic projection apparatus or the like. This will be elucidated in the description of the preferred embodiments. Alternatively, it is possible to fixedly connect the first housing to the second housing. This may be advantageous to ensure optimum positioning, e.g. when one or more of the housing have an opening for maintenance etc.

Advantageously, one of the optically transmissive windows of the first housing and one of the optically transmissive windows of the at least one second housing form one common optically transmissive window. E.g. in a case where the first and second housings are directly connected the one behind the other, it is possible to provide only one common optically transmissive window between the first and second housing. This offers the saving of one such window, while still providing two separate chambers. It is, however still possible to provide separate optically transmissive windows for those housings. The latter may be advantageous when the first and second housing are for example detachably connected to each other, which allows e.g. exchanging or removal of one housing without having to open another housing. Alternatively, it is also possible to fixedly connect the first housing to the second housing, in which case it is also possible to provide one integral housing combining the first and second housing, with separate first and second chambers. Such first and second, and possibly more chambers may be regarded as compartments of one housing.

Advantageously, the optical system further comprises a lens actuator for moving the at least one moveable lens. It is not strictly necessary to provide a lens actuator, yet providing such a lens actuator offers better control over the optical performance of the optical system. Such a lens actuator may be embodied according to many known concepts, such as a separate motor in the first chamber, magnetic coupling, etc.

Advantageously, the lens actuator comprises a linear motor with a magnet part and a conductor part, wherein the moveable lens is connected to one of the conductor part and the magnet part. A linear motor, which as such is known in the state of the art, offers the possibility of contactless actuating and moving of the moveable lens. This further reduces production of particles due to abrasive friction or due to possibly required lubricants.

More advantageously, the moveable lens is connected to the magnet part provided in the first chamber, wherein the conductor part is provided outside the first housing. In this embodiment, the housing is effectively located between the magnet part and the conductor part, wherein the housing may be regarded as a wall. The wall is then preferably transmissive for magnetic fields, and may be made of e.g. certain types of stainless steel or other non-magnetic metals. An advantage of this embodiment is that the conductor part may be kept out of the first chamber. The conductor part often comprises wires or conductors which are provided with an insulating plastics coating. Such a plastics coating often contains softening agents, in particular certain kinds of hydrocarbons, which may be very harmful for in particular coatings of lenses. It is very desirable to keep general hydrocarbon levels as low as possible. Furthermore, plastics that are exposed to scattered short-wave radiation inside the chamber will degrade and decompose rather quickly. Not only does this influence the insulating properties of the cable, but also the quality of the gas atmosphere in the chamber. Moreover, such a cable connected to a moveable conductor part will move during operation. Repeated movements may induce damage or even breaking of the cable, which is of course to be avoided. Therefore, it is advantageous to keep all plastics, especially the ones with softening agents, as much as possible out of the chamber(s) with optical elements. Since the magnet part of a linear motor need not be connected to a current source, and often does not contain such plastics, or at least need not contain such plastics, the present embodiment offers a further possibility to reduce pollution of the gas atmosphere in the chamber(s). Note, that it is still possible to provide both or all parts of the linear motor inside a chamber, when the obtainable pollution levels etc. are satisfactory. For example, it is possible to employ improved purging.

In another advantageous embodiment, at least one of the magnet part and the conductor part is coated with an outgassing-prevention coating. Such an outgassing-prevention coating offers another possibility of reducing pollution levels, in particular hydrocarbon levels. One or more parts of the linear motor, or advantageously any other exposed surface in a chamber, may be coated with such a coating.

The coating may comprise a substantially gas-tight material, such as a metallic coating, a glass or glass-like coating, ceramic coatings etc. The thickness of the coating may depend on the actual material used, and may be as low as 30 μm., which retains sufficient flexibility of wires etc. Another exemplary metal coating may be a nickel coating, e.g. for a magnet part of the linear motor.

Alternatively, the invention provides an optical system constructed and arranged for use in a lithographic projection apparatus, the optical system comprising a first housing, with a first chamber inside the first housing, a source of radiation, a first optically transmissive window, at least one gas exchange opening in communication with the first chamber, and at least one moveable lens in the first chamber, at least one additional optical element outside the first housing, wherein an optical path is defined from the source of radiation through the at least one moveable lens, the first optically transmissive window and by the at least one additional optical element. In this embodiment, a source of radiation is incorporated in a first housing.

Such a configuration offers the advantage that a large part of the optical path may be accommodated in a controlled environment, with gas of known properties. In this embodiment, only one optically transmissive window is required in order for the radiation to leave the housing. Of course, a plurality of such optically transmissive windows maybe provided, e.g. in order to provide a plurality of beams of radiation. Furthermore, this embodiment may be combined with all features mentioned above, where technically possible, in order to provide the advantages as described.

Moreover, advantageously, the optical system of the above embodiment is constructed and arranged for providing a projection beam of radiation for illuminating a patterning device. This optical system is most advantageous when the at least one additional optical element is present between the patterning device and the source of radiation. In other words, the optical system as provided has at least one optical element located before the patterning device, but outside a first chamber, i.e. outside a protected environment for the at least one moveable lens.

In a further aspect, the present invention relates to a lithographic projection apparatus comprising a radiation system constructed and arranged for supplying a projection beam of radiation, a support structure constructed and arranged for supporting a patterning device, the patterning device serving to pattern the projection beam according to a desired pattern, a substrate table constructed and arranged for holding a substrate; and a projection system constructed and arranged for projecting the patterned beam onto a target portion of the substrate, wherein the radiation system comprises an optical system according to the invention. In particular, the optical system of the radiation system consists of optical elements between some source of radiation and the patterning device, wherein at least one of those optical elements, called at least one additional optical element for the purposes of this invention, is located outside a first housing which accommodates the at least one moveable lens. The advantages of this set-up have already been described in connection with the optical system. Note that such a lithographic projection apparatus, and in particular the optical system thereof, may be combined with any advantageous feature as mentioned above.

Advantageously, the radiation system comprises an optical system with a built-in radiation source, according to the invention. As mentioned above, this offers the possibility of an even better controlled optical path and hence optical properties and performance of the lithographic projection apparatus. Note that the optical system for the radiation system of this embodiment need only have one optically transmissive window, although a plurality of such windows is possible.

In particular, with respect to the optical path, the optical system and the at least one additional optical element are positioned on the same side of the support structure. For this embodiment it is to be stressed again that it is the taking out of at least one optical element, out of the first housing with the controlled environment, which offers an advantage according to the invention. Note that in the case of a reflective patterning device, it is not the physical side of the patterning device that is considered. Rather, the part of the optical path defined by the various optical elements of the optical system according to the invention up to the point of reflection at the reflective patterning device, or alternatively, from the point of reflection at the reflective patterning device, which is considered here. In the alternative case of a transmissive patterning device, the term "sides" has its usual meaning.

In an alternative embodiment of the invention, there is provided a lithographic projection apparatus comprising a radiation system constructed and arranged for supplying a projection beam of radiation, a support structure constructed and arranged for supporting a patterning device, the patterning device serving to pattern the projection beam according to a desired pattern, a substrate table constructed and arranged for holding a substrate and a projection system constructed and arranged for projecting the patterned beam onto a target portion of the substrate, wherein the projection system comprises an optical system which is constructed and arranged for receiving a patterned beam of radiation and for projecting the patterned beam of radiation onto a substrate.

In particular, this optical system relates to a projection lens that receives a beam of radiation which has been patterned by the patterning device, and which projects this patterned beam onto a substrate. In particular, the at least one additional optical element is positioned between the support structure and the substrate table. Again, the issue here is that at least one optical element of the optical system, which is now often called a projection lens, is taken out of a protected environment for the at least one moveable lens. Note that the word "between" in the context of the present embodiment need not relate to a physical position, but rather relates to the point along the beam of radiation, which should be between the support structure or patterning device therefor, and the substrate or substrate table therefor.

In the above, the invention has been elucidated both generally, and in the form of preferred embodiments. It is repeated that it is the division between the at least one moveable lens inside a housing and at least one optical element outside the housing which offers the advantages as described. It is to be noted that the term "additional optical element" need not relate to the addition of an optical element to an existing optical system, but rather to the removing of an additional optical element out of a housing to a position outside the housing. An alternative way of describing the optical elements in the optical system, and their relationship could be that the optical system comprises a plurality of optical elements, at least one of which is a moveable lens within a first housing, and at least one of which is an optical element outside that first housing.

BRIEF DESCRIPTION OF DRAWINGS

The invention will now be elucidated further by means of a number of exemplary and non-limiting preferred embodiments, with reference to the drawings, not drawn to scale, in which.

DETAILED DESCRIPTION OF THE INVENTION

Figure 1:
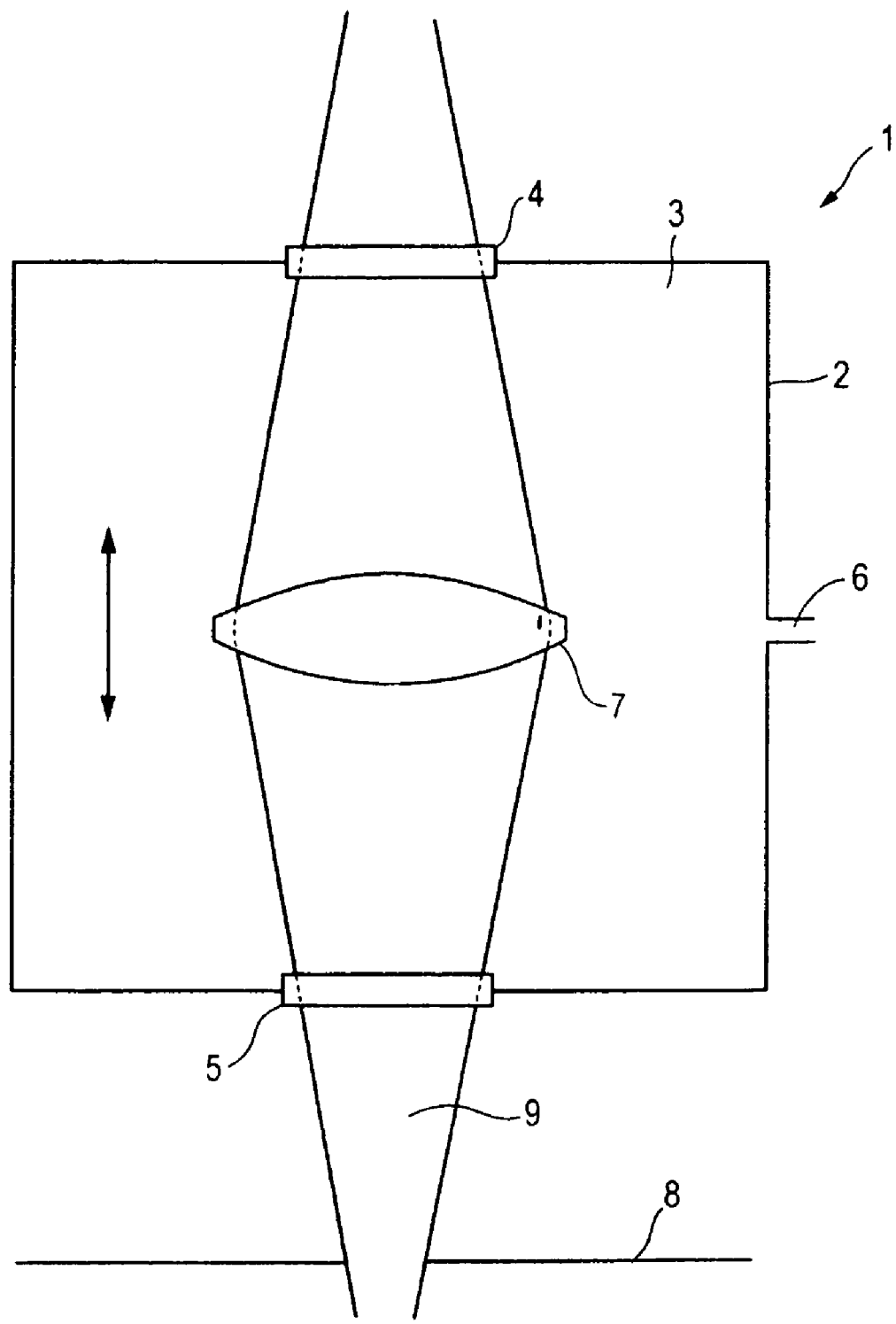
FIG. 1 shows diagrammatically the first embodiment of the optical system according to the invention.

FIG. 1 diagrammatically depicts the first embodiment of the optical system according to the invention. The optical system is generally denoted with reference numeral 1. The optical system 1 comprises a housing 2 with a chamber 3 therein. A first optical window 4 and second optical window 5, as well as a moveable lens 7 and a blind 8 define an optical path for a beam of radiation 9. 6 is a gas exchange opening.

The optical system 1 is a simple system, yet offering the advantages of the present invention. The housing 2 may have any suitable shape, such as a box or cylinder. It may be made of any desirable material, but preferably a material that is gas-tight and/or has good outgassing properties. The latter property relates to a low level of gases emitted by the material. Examples are stainless steel and other metals, especially nickel or gold coated. Other materials are, however, not excluded.

The chamber 3 in the housing 2 accommodates the moveable lens 7. A protective atmosphere may be maintained in the chamber 3. This will be elucidated below.

Optically transmissive windows 4 and 5 may comprise of any suitable transmissive material, and may have any suitable shape, such as round or square. The transmissive material may be glass, mica, quartz, etc. In general, the material should be transparent for the radiation used. In this respect, the term "optically" refers to electromagnetic radiation having a wavelength in the near infrared, visible or ultraviolet region, in particular having a wavelength of between 100 nm and 800 nm.

Reference numeral 8 refers to a blind. This blind is used to provide the beam 9 of optical radiation with desired dimensions. Thereto, the blind 8 may comprise an aperture in a non-transmissive plate, moveable blades, etc.

The moveable lens 7 may be moveable in the direction of the arrow A. Alternatively or additionally, the moveable lens 7 may be moveable in a direction perpendicular to the direction of arrow A. The moveable lens 7 may be suspended by any suitable support structure (not shown), such as bars, bearings, wires, etc.

Often, such a lens is coated with a coating, e.g. an anti-reflection coating, in order to improve the optical quality. However, in many cases such a coating is rather sensitive to influences from outside, such as chemical reactions with gases in the environment, or more generally simply the deposition of materials and (dust) particles. Therefore, the housing preferably comprises a gas exchange opening 6. By means of this gas exchange opening 6, a gas or gas mixture of desired properties maybe provided in the chamber 3. Thereto, a container (not shown) containing the desired gas or gas mixture may be connected to the gas exchange opening 6. Alternatively, or additionally, a pump may be connected to the gas exchange opening 6, to evacuate the chamber 3.

Note that it is also possible to provide only one or at least one optical system according to the invention. For example, a lithographic apparatus having a first optical system according to the invention 11 with a zoom lens, a second optical system with a zoom lens, wherein at least one of the optical systems 11 and 12 (such as the first system 11) comprises at least one additional optical element, comprising at least one of a moveable blind, a filter, a polarizer or a mirror.

The optical system shown is suitable for use in a lithographic projection apparatus. However other uses are not excluded. Examples may be other high-performance projection apparatus, such as episcopes, or optical apparatus to be used in an aggressive environment, such as in a chemical factory.

Figure 2:
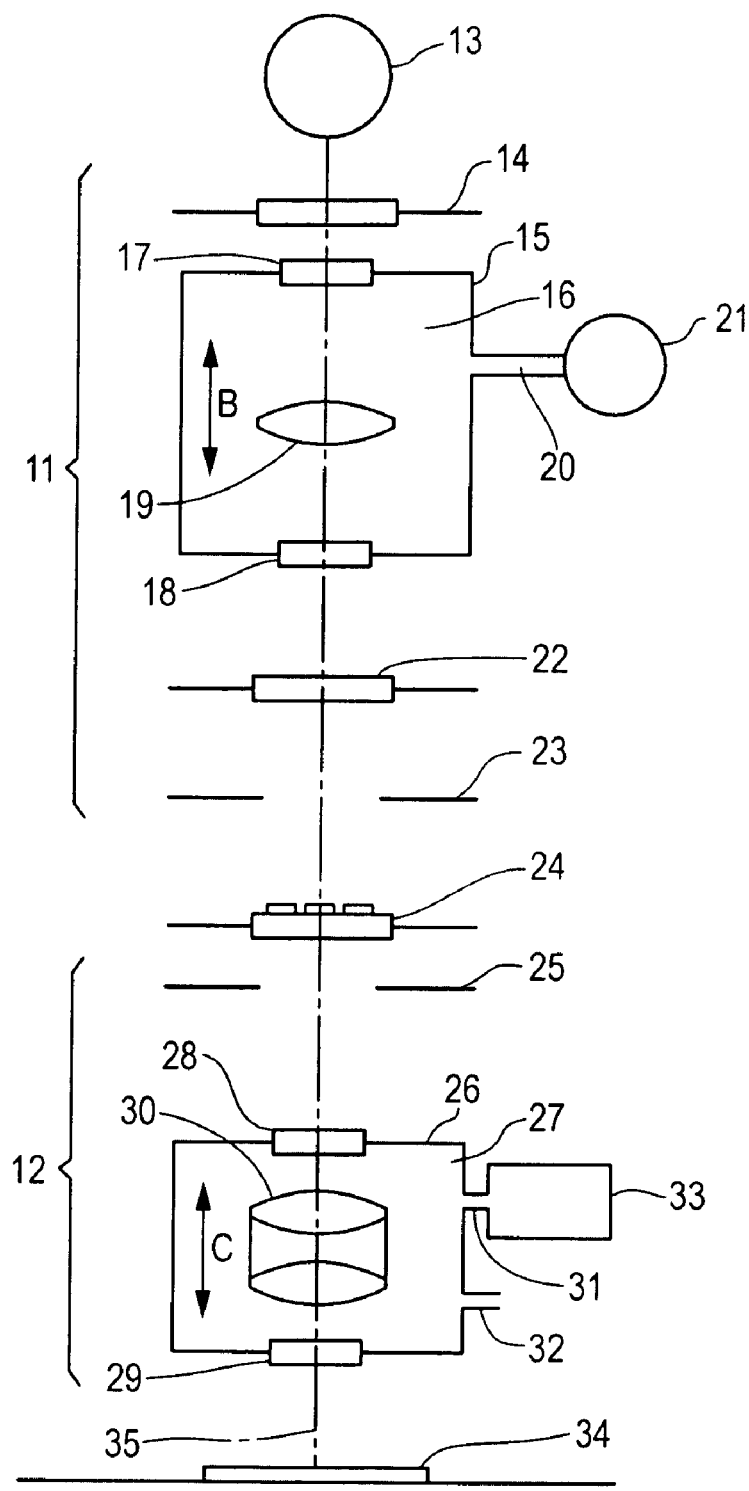
FIG. 2 shows diagrammatically, a first embodiment of a lithographic projection apparatus according to the invention.

FIG. 2 shows diagrammatically, a first embodiment of a lithographic projection apparatus according to the invention. Herein, reference numeral 11 is a first optical system according to the invention and 12 is a second optical system according to the invention, and 13 is source of radiation.

In the optical system 11, 14 is an optical filter, 15 is a first housing with a first chamber 16, a first optically transmissive window 17, a second optically transmissive window 18, a first moveable lens 19 and a gas exchange opening 20. A pump 21 is connected to the gas exchange opening 20.

A polarizer is indicated by 22, while 23 indicates a moveable blind, which may however also be non-moveable. A patterning device 24 is present between the optical systems 11 and 12.

The second optical system 12 comprises a moveable blind 25 and a second housing 26 with a chamber 27, and with a third optically transmissive window 28, a fourth optically transmissive window 29, a second moveable lens 30, a first gas exchange opening 31 and a second gas exchange opening 32. A cylinder 33 with pressurised gas is connected to the first gas exchange opening 31.

A substrate to be illuminated by radiation passing through the optical systems 11 and 12, is denoted with 34. The first moveable lens 19 is moveable in a direction indicated by arrow B, while the second moveable lens 30 is moveable in the direction of an arrow C. Both lenses may be zoom lenses, in which case they may comprise a plurality of lens elements at least one of which is moveable with respect to the others. Zoom lenses are i.e. used for varying a magnification, e.g. when imaging a patterned beam of radiation onto a substrate. An optical path through the optical systems 11 and 12 and the patterning device 24 has been indicated by a dashed line 35.

The first optical system 11 comprises a first housing 15 and a plurality of additional optical elements, in this case three, to wit a filter 14, a polarizer 22 and a blind 23. Please note that any other positive number of additional optical elements is also allowed. The optical elements may be mutually the same, such as a number of blinds at different positions, or be different as in the present example.

The additional optical elements may be selected according to the desired optical properties of the optical system. Thereto, e.g. a filter may be selected in order to remove undesired parts of the radiation of the source 13, a polarizer may be used in order to obtain a desired direction of the polarization of the radiation, while a blind may be used to impart certain dimensions to the beam along the optical part 35. However, other optical elements may also be used as desired. In this respect, the term "optical element" should be interpreted as an element impart certain desired properties to the beam that passes through, or is reflected or partly absorbed by the optical system under consideration. In this respect, e.g. a dust particle, which reflects or absorbs a part of the beam, does not impart a desired property to the beam, and hence is not considered an optical element in this respect.

A pump 21 is connected to the gas exchange opening 20, which is in communication with the first chamber 16. The pump 21 may ensure that a vacuum is maintained in the chamber 16, thereby preventing as much as possible any influence of gases on e.g. the moveable lens 19. The pump may be any desired type of pump for producing a vacuum, while the performance of the pump may be adapted to the desired vacuum.

The optical system 11 is e.g. constructed and arranged for receiving radiation, in this case from source 13, and converting the radiation into a projection beam of radiation for illuminating a patterning device 24. Note that in this case every optical element of the optical system 11 is present between the source 13 and the patterning device 24, while only the moveable lens 19 is present in the chamber 16. Hence the moveable lens 19 is optimally protected against any possible deleterious influence of any other optical element 14, 22, 23 in the optical system 11. Note that in the above, the source 13 is deemed not to be a part of the optical system 11. However, alternatively, the source may be a part of an optical system according to the invention, as will be elucidated e.g. in connection with FIG. 3.

The patterning device 24 imparts a desired pattern to the beam of radiation coming from the first optical system 11. The thus patterned beam of radiation is provided to a second optical system 12.

The second optical system 12 comprises a second housing 26 and an additional optical element 25, in this case a blind, although other optical elements are not excluded.

The second housing 26 comprises a second chamber 27 therein, with a second moveable lens 30. The second moveable lens 30 in this case comprises three lens elements, and hence is a composite lens. In practice, lenses in lithographic projection apparatus are often very complex and large composite lenses. Often, the lens elements in these lenses are multi-coated, while this coating may be very sensitive to oxygen, hydrocarbons etc. Hence protection is desirable.

The third and fourth optically transmissive windows 28 and 29, as well as the first and second optically transmissive windows 17 and 18 of the first optical system, may again have any suitable shape and may be made of any suitable and optically transparent material.

In this example, a container 33 containing pressurized gas is connected to gas exchange opening 31, while gas exchange opening 32 may remain open. The pressurized gas will flow from the container 33 through the gas exchange opening 31 into the chamber 27. The gas will thus purge the chamber 27 and everything contained therein, such as the second moveable lens 30. Excess gas will subsequently escape through a second gas exchange opening 32.

The patterned beam of radiation (not shown) that has been received by the second optical system 12 and has passed therethrough, will subsequently be emitted and projected onto substrate 34. The substrate may comprise a material which is sensitive to the radiation, by means of which a desired pattern may be imparted to the substrate. By means of this method, e.g. semiconductor devices may be made, with methods which are per se known in the state of the art.

The second optical system 12 is e.g. constructed and arranged for receiving a patterned beam of radiation and for projecting the patterned beam of radiation onto a substrate 34. Such a system is sometimes called a projection system, while the first optical system 11 as described in FIG. 2 is sometimes called an illuminator or illuminator system.

The diagrammatical set-up of a lithographic projection apparatus in FIG. 2 is of the transmissive type, i.e. generally the optical systems and the patterning device therein are at least partly transmissive for the radiation used.

Figure 3:
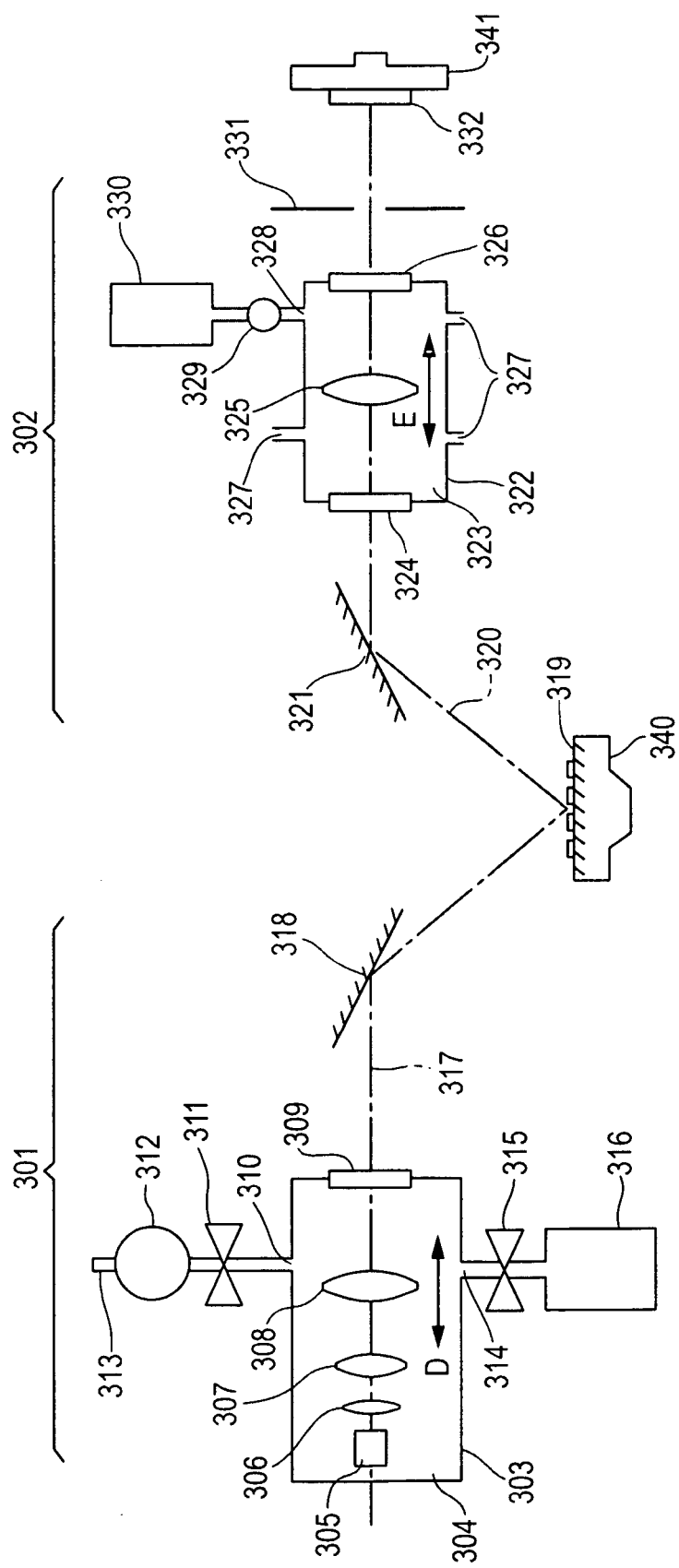
FIG. 3 shows a diagrammatical second embodiment of a lithographic projection apparatus according to the invention, in particular one of the reflective type.

FIG. 3 shows a diagrammatical second embodiment of a lithographic projection apparatus according to the invention, in particular one of the reflective type. Reflective refers to at least the patterning device 319 being of a reflective type in stead of a transmissive type.

The lithographic projection apparatus according to this second embodiment comprises a first optical system 301 and a second optical system 302 as well as a first table 340 and a second table 341. The first table 340 holds patterning device 319, while the second table 341 holds a substrate 332.

The first optical system 301 is yet another embodiment of the optical system according to the invention. The system comprises a first housing 303 with a chamber 304, a light source 305, a first lens 306 a second lens 307, a first moveable lens 308 and a first optically transmissive window 309. A first gas exchange opening 310 is sealable by means of first valves 311 and is connected to a pomp 312 having an exhaust 313.

A second gas exchange opening 314 in sealable by means of a second valve 315 and is connected to a container 316 with pressurized gas. A beam 317 also indicates an optical path. The beam 317 is reflected towards patterning device 319 by first mirror 318, which serves as an additional optical element.

Patterning device 319 reflect the beam, which is now a patterned beam of radiation 320, towards a second mirror 321. The second mirror 321 is an additional optical element in the second optical system 302.

The second optical system 302 comprises, in addition to second mirror 321, a second housing 322 with a second chamber 323, a first optically transmissive window 324, a second optically transmissive window 326, a second moveable lens 325, a third gas exchange opening 327 and a fourth gas exchange opening 328. A control valve 329 regulates gas exchange between container 330 and a fourth gas exchange opening 328. 331 is a blind, forming an additional optical element in the second optical system 302.

In the first optical system 301, the first and second lenses 306, 307 and the first moveable lens 308 may be the to form one composite lens, one element of which is moveable with respect to the first housing.

In this case, the source 305 of radiation is accommodated in the first chamber 304. This offers the possibility of controlling the gas environment of not only the lens or lens elements in the first chamber 304, but also of the radiation source 305 and all of the optical path inside the first chamber 304.

To that end, the chamber 304 may be purged by gas, e.g. from a container 316. Furthermore, any gas, e.g. purging gas or originally present gas, inside the first chamber 304 may be pumped out of the chamber by means of pump 312 and away through exhaust 313. In order to prevent gas movement inside the first chamber 304, the first chamber 304 may be sealed by means of a first valve 311 and a second valve 315. The absence of gas movements inside the chamber 304 further improves the optical quality of the optical system 301.

The first mirror 318 may be used to direct a beam of radiation 317 towards a patterning device 319, in order to have a suitable shape and compactness of the total lithographic apparatus. Note that the lithographic apparatus as shown in FIG. 3 may be enclosed as a whole within a larger housing (not shown). The larger housing may also contain a protective atmosphere, e.g. dust free, and consisting of an inert gas, such as nitrogen, dry air, helium, or any other suitable gas. Note however, that it is now possible to have different levels of quality of the gas atmosphere, e.g. the larger housing may have a dry air atmosphere which is dust free up to a certain level, while the first housing may have e.g. a nitrogen atmosphere with a different level of dust freedom, while the second housing 322 may have yet another atmosphere, such as a helium atmosphere.

Figure 4:
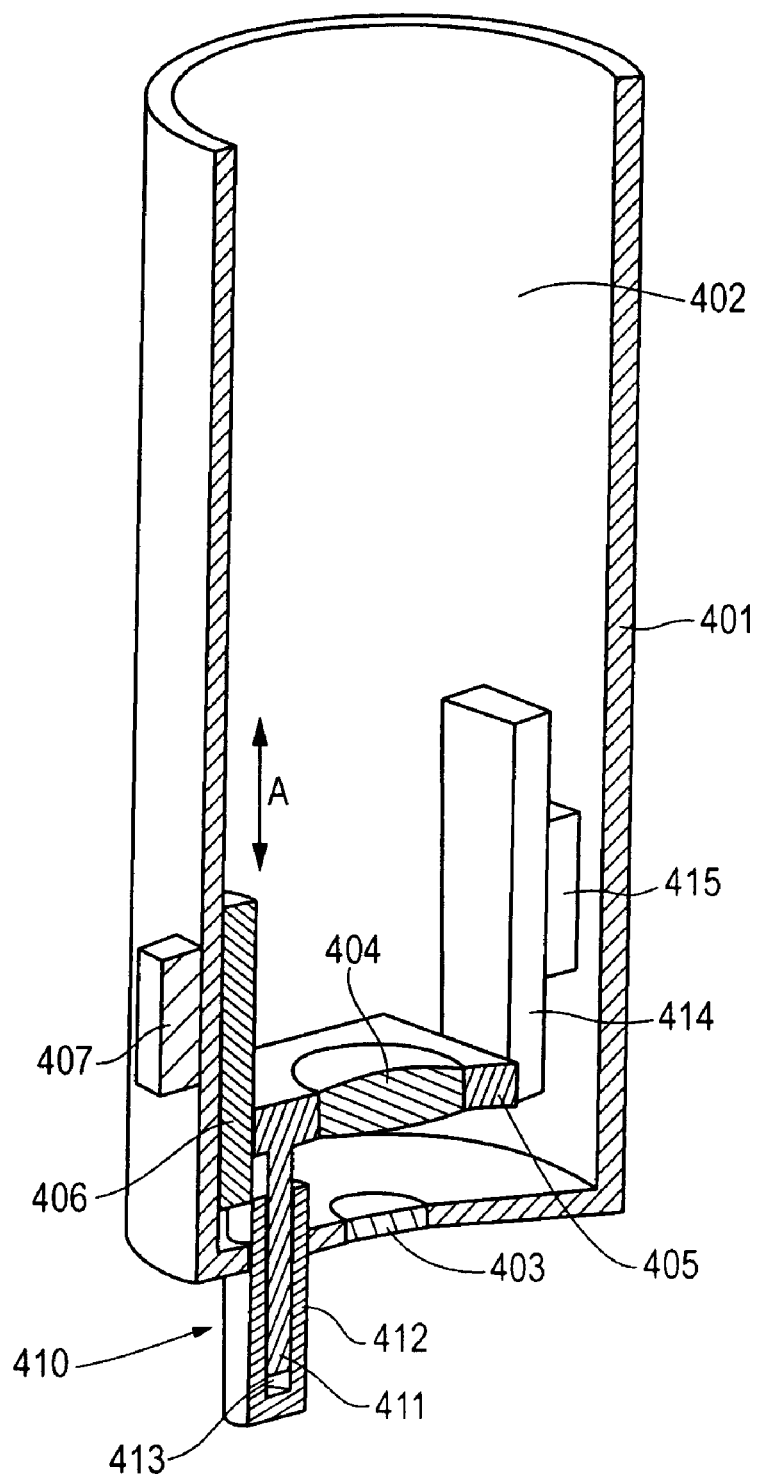
FIG. 4 shows a cross-section of a detail of an optical system according to the invention.

FIG. 4 shows a cross-section of a detail of an optical system according to the invention. Herein 401 denotes a first housing with a first chamber 402. 403 is a first optically transmissive window and 404 is a moveable lens, mounted in a lens holder 405. 406 is a magnet part of a linear motor, while 407 denotes a coil part of the motor. A gravity compensator is generally denoted by numeral 410 wherein 411 denotes a piston which is moveable in a cylinder 412. 413 denotes a pressure chamber.

A first and a second gas bearing block are denoted by numerals 414 and 415, respectively. It is noted here that the detail shown here does not show a second optical window nor an additional optical element, which however may be present in the complete optical system according to the invention.

The moveable lens 404 as shown here is mounted in a lens holder 405. The lens holder 405 is connected to a moveable piston 411. This piston 411 is moveable in a cylinder 412 in the direction indicated by arrow A. This movement may be brought about by changing a pressure in the pressure chamber 413, between the piston 411 and the cylinder 412. This pressure change may be controlled by pumping gas into or out of the pressure chamber 413, by pressurizing means (not shown). It is for example and advantageously possibly to use a purging gas for pressurizing the pressure chamber 413. Any gas leaking away between the cylinder 412 and the piston 411 into the chamber 402 does not cause pollution problems.

The gravity compensator as described above will function to compensate for the weight of the moveable system, e.g. the moveable lens 404, the lens holder 405, the piston 411 and the magnet part 406 of a linear motor. By controlling the gas pressure in the pressure chamber 413 such that the product of gas pressure and cross sectional surface area of the piston 411 in the cylinder 412 substantially equals the weight of the moveable system, the system will not move downwards under the influence of the gravitational force. This allows the required force of the linear motor, and thus the dimensions of the linear motor, viz. the magnet part 406 and the coil part 407, to be smaller. It is noted here that the linear motor is only very generally depicted here. In this case the magnet part 406 is attached to the lens holder 405, although it is also possible to attach the coil part 407 to the lens holder. However, it is advantageous to locate the coil part 407 outside the housing 401, because often conductors are embedded in, or are coated with plastics that contain materials which may outgas and thus affect optical elements in the chamber 402.

A gas bearing for contactless guiding of the moveable lens is shown, consisting of a first and a second gas bearing block 414 and 415, respectively. The gas bearing is also shown only very diagrammatically, although it is noted that the gas bearing block 414, which is connected to the lens holder 405 is larger than the second gas bearing block 415, although the reverse situation, which occurs more often, is not excluded.

Figure 5:
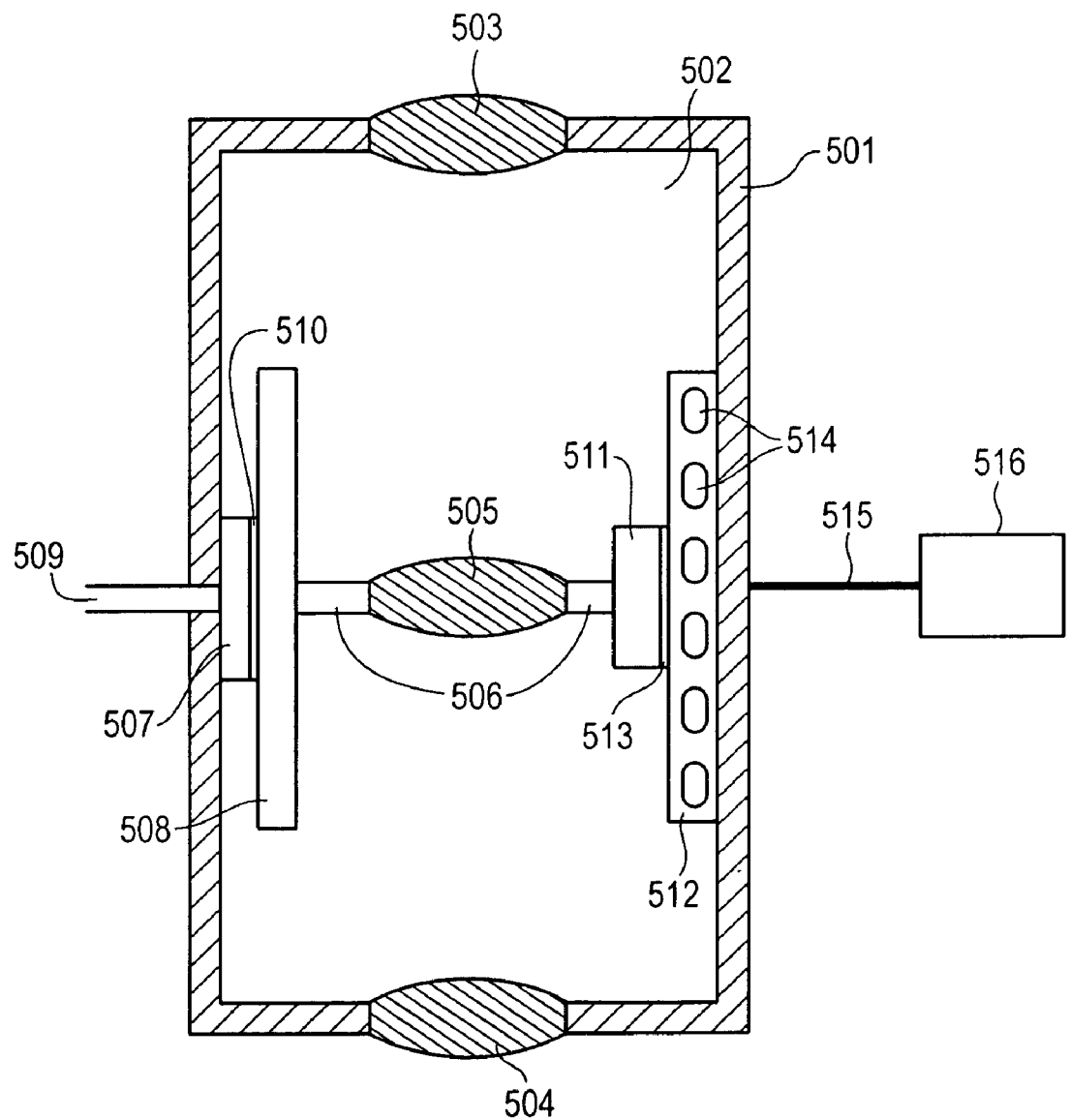
FIG. 5 shows a detail of an embodiment of an optical system according to the invention.

FIG. 5 shows a detail of an embodiment of an optical system according to the invention. In particular, a housing is shown. The housing 501 comprises a chamber 502 therein. A first and a second optically transmissive element are denoted by 503 and 504, respectively. 505 denotes a moveable lens and 506 denotes a lens frame construction. 507 denotes a first gas bearing block while 508 denotes a second gas bearing block, 510 being a first gap therebetween, while 509 denotes a gas supply.

Reference numeral 511 denotes a magnet part of a linear motor, while 512 denotes a conductor part of a linear motor, a second gap 513 being present therebetween. 514 denote conductors in the conductor part 512, which are in this case actuatable via cable 515 which is connected to a controllable power source 516.

In FIG. 5, a first embodiment of a lens actuator is shown, as well as an embodiment of a contactless guiding mechanism for the lens. In this case, the contactless guiding mechanism comprises a gas bearing 507, 508. The gas bearing comprises a first and second gas bearing block 507, 508. The first gas bearing block, which is connected to a gas supply 509, may comprise one or more gas outflow openings, which are not shown in any detail. The gas may flow out in a relatively small first gap 510 of say 10–20 μm between the first and second gas bearing block. Note that the second gas bearing block 508 is larger than the first gas bearing block 507 having the gas outflow openings.

Normally, this is the other way around, because the moving mass would be smaller. However, in a gravity compensated design, this may not be as much of a factor, and the set-up as shown has certain advantages. For example, a small fixedly positioned first gas bearing block with gas ejection openings combined with a large moveable second gas bearing block without gas supply does not need any gas supply tube, which would have to be flexible. As such a tube will almost be made of plastics, again the problems with UV-degradability and outgassing would be introduced in the chamber. By providing only the static gas bearing block with a gas supply, which may be kept outside the chamber, such problems are avoided. As gas bearings are itself known in the state of the art, they are not discussed in more detail here, as the skilled person will readily embody a gas bearing.

Further there is shown a lens actuator in the form of a so-called linear motor. The linear motor as diagrammatically shown here comprises a magnet part 511 and a conductor part 512 with a gap 530 therebetween. The conductor part 512 comprises a number of conductors 514. The number may be any natural number, such as between 2 and 20, wherein a larger number gives a more precise control over positioning of the moveable lens 505 but also more complexity.

The conductors 514 are controllable e.g. via cable 515 by a controllable power source 516. Power source 516 may energize the desired conductors 514.

The linear motor shown here, as an example of a lens actuator, is located in the chamber 502. In order to move the moveable lens 505, which is connected to the magnet part 511 via lens frame 506, one or more conductors 514 are appropriately energized. The interaction between the magnetic field of the magnetic part 511 and the current through the conductors 514, known as the Lorentz force, will position the magnetic part 511, and thus the moveable lens 505 in a desired position.

The lens actuator shown here is just an example of a "motor" for the moveable lens 505. Other embodiments are also possible, such as in principal any type of electromotor, pressurizable gas cylinder etc. However, a linear motor has the advantage that it is a contactless motor, not requiring any type of lubricant, but yet offering a high precision. The absence of lubricants and of friction between the moving parts ensures that the gas atmosphere in the chamber 502 may be well controlled, and be kept free of small particles originating from abrasive friction.

Furthermore, the conductor part 512 and or the magnet part 511 often comprise materials which may outgas, such as epoxy resins or other plastics that might surround the conductors 514. Plastics often comprise softening agents, especially in plastics that cover wires. These plastics may outgas, causing possibly unacceptably high levels of hydrocarbons or other gases. Hence, preferably, at least one of the magnet part 511 and the conductor part 512 is at least partly covered with a coating which substantially prevents outgassing of the covered parts. Advantageously, the coating comprises a glass or glass-like material. However, alternatives, such as thin metal layers are not excluded. Metal layers may give rise to eddy currents, due to changing electromagnetic fields. Hence it may be advantageous to select a metal or alloy with a relatively low conductivity.

In the embodiment shown, the lens is connected to the magnet part of the linear motor. However, it is also possible to connect the lens to the conductor part of the linear motor. Also, in the embodiment shown, the first and second optically transmissive elements 503 and 504 are lenses. Hence these elements 503 and 504 not only function as windows, but also as an element changing the desired properties of a beam of radiation passing therethrough, as optical elements. Alternatively, only one of the optically transmissive elements 503 and 504 is embodied as a lens, whereas the other is embodied as just a window, i.e. a plane-parallel slab of transparent material.

Figure 6A:
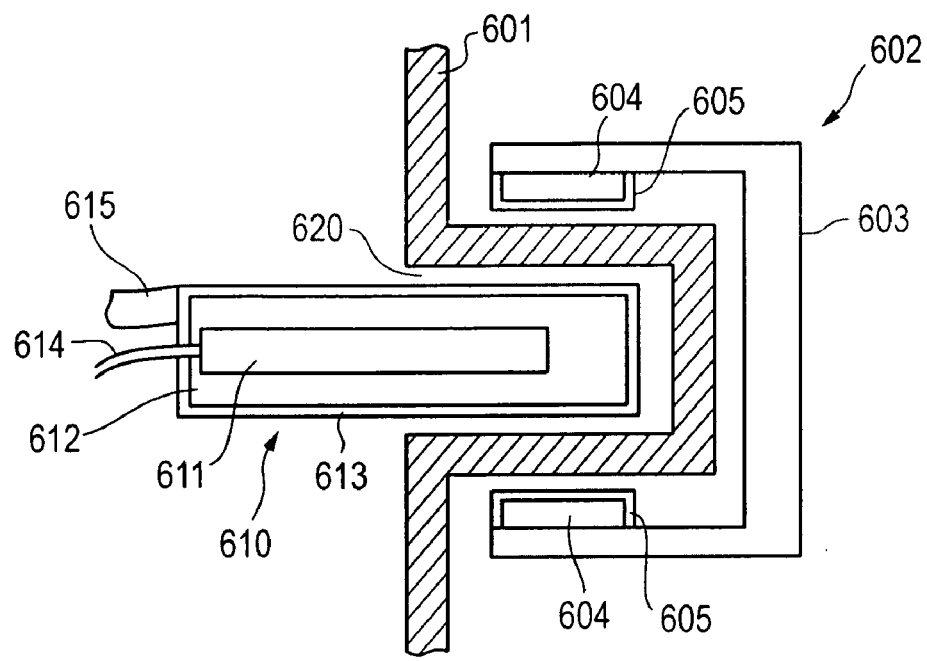
FIGS. 6A and 6B show two details of a linear motor
Figure 6B:
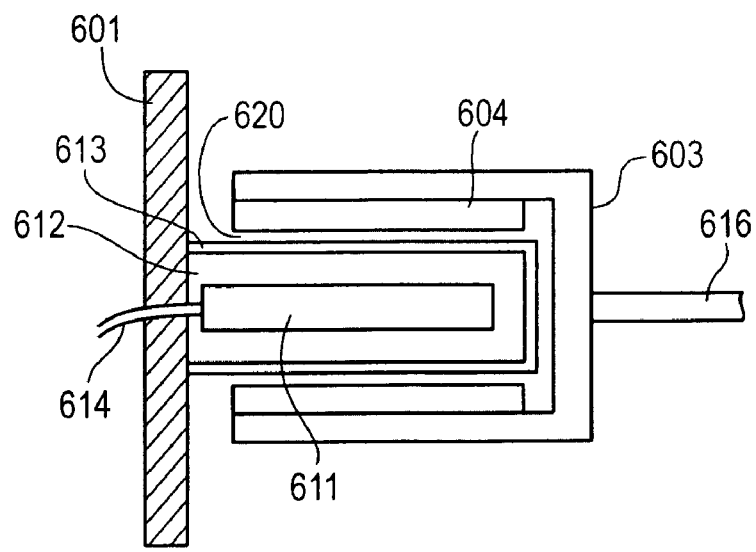

FIGS. 6A and 6B show two details of a linear motor. In FIG. 6A, 601 is a housing, while 602 generally denotes a magnet part of the linear motor and 610 generally denotes a conductor part of the linear motor.

In the magnet part 602, 603 is a frame to which magnets 604 are fixedly attached. 605 is a protective coating. In the conductor part 610, 611 denotes a conductor, embedded in an insulating material 612, while 613 denotes a protective coating. 614 is a cable connected to the conductor 611, while 615 denotes a structure connected to a moveable part (not shown). 620 denotes a gap between the conductor part 610 and the housing 601.

In the embodiment shown in FIG. 6A, the magnet part 602 and the conductor part 610 are separated by the housing 601. This offers the possibility that possibly negative influences of the magnet part 602 may be kept away from the conductor part 610 and everything that is in the same space. In practice, it is for example possible that the conductor part 610 is located in a chamber (not shown) inside housing 601, which in the drawing may be deemed to be present to the left of the housing 601.

A moveable lens or other optical element, connected to the conductor part 610, may then be protected against deleterious influences of the magnet part 602. Note that it is also possible to reverse the location of the magnet part and the conductor part, such that the moveable lens etc. is connected to a magnet part 602, which is located in a chamber. This latter embodiment ensures that possibly deleterious effects of the conductor part are avoided.

In practice, the conductor part 610 is often embedded in an insulating material, such as epoxy resin or some other plastic material. Furthermore, if the moveable part is connected to the conductor part 610, which then also is moveable, an electrical cable 614 connected to the conductor(s) 611 will be flexible. To that end the cable will often be coated with an insulating and flexible coating. Such coating will often comprise a plastic that has been treated with a softening agent. The softening agent, or the plastic itself, will often emit gases into its environment. If the chamber with the moveable lens or the like is that environment, possibly unacceptably high levels of hydrocarbons or other gases may be caused.

In such a case, it is advantageous to accommodate the magnet part 602 in the chamber and have this connected to the moveable part, while the conductor part 610, and the plastics are accommodated outside the chamber.

To allow a movement of the conductor part 611 without much friction, there is an (air) gap 620 between the conductor part 610 and the housing 601. It is advantageous to have an air gap 620 as small as possible, in order to have a maximum coupling between the conductor part 610 and the magnet part 602. Note that the distance between the magnet part 602 and the conductor part 610 in this case always comprises the width of the air gap 620, which may also be a "vacuum gap", and the thickness of the housing 601. Note that it is possible to mount the magnets directly to the housing 601, without there being a gap therebetween.

FIG. 6B shows an alternative version of the linear motor, similar parts being denoted with the same reference numerals. In the embodiment shown, the distance between a magnet 604, which is in this case non-coated, and the conductor 611 of the conductor part may be made much smaller. The distance is in this case equal to the width of the gap 620 and the thickness of only one protective coating 613. Since such coating may be made very thin, e.g. of the order of between b 1 1 and b 50 1 micrometer, or thicker of course, depending on the material of the coating 613, the coupling between the magnet 604 and the conductors 611 may be made much better. This allows a smaller current to be used in the conductor 611, thus allowing a smaller linear motor but above all a lower power. This lower power ensures that there is less heating up of the parts of the linear motor and thus of the environment. This is very advantageous for the optical system, since especially in lithographic projection apparatus, heating up and the associated expansion and distortion of various elements, should be kept as low as possible.

Figure 7:
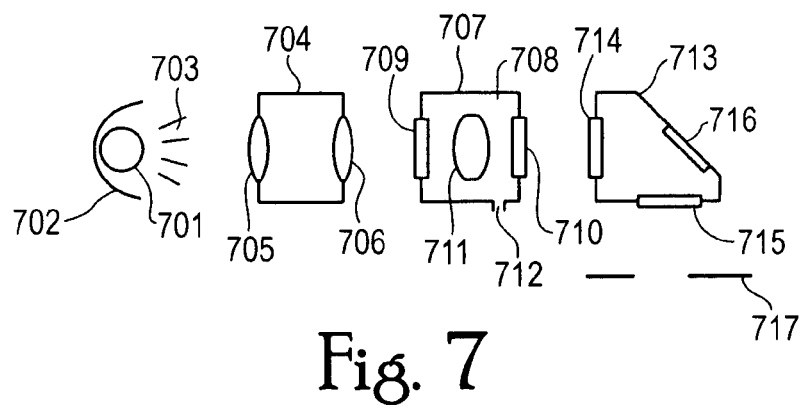
FIG. 7 shows another embodiment of an optical system according the invention.

FIG. 7 shows another embodiment of an optical system according the invention. Herein, 701 is a source of optical electromagnetic radiation, 702 is a reflector and 703 is an emitted beam of optical electromagnetic radiation. 704 denotes a condenser housing, having first and second condenser lenses 705 and 706, respectively. 707 is a second housing with a chamber 708, a first optically transmissive window 709, a second optically transmissive window 710, a moveable lens 711 and a gas exchange opening 712. 713 denotes a third housing with a third optically transmissive window 714, a second optically transmissive window 715 and a mirror 716. 717 denotes a moveable blind.

The source of radiation 701 may be any suitable source, such as a mercury lamp, an excimer laser and so on. 702 is a suitable reflector, such as a parabola. Note that in the case of a laser, such an external reflector 702 is not required. The source of radiation 701, if desired combined with the optional reflector 702, emits a beam of radiation 703.

The housing 704 with the two condenser lenses 705 and 706 function e.g. to give the beam desired starting dimensions. This is especially helpful in the case of a laser beam, wherein an appropriate set of lenses 705 and 706 may function as a beam expander.

The second housing 707 of FIG. 7 corresponds to the first housing of FIG. 1. Therefore, the discussion thereof is not repeated here. However, it is noted that the second housing 707 is in this case the only housing with a gas exchange opening. The other housings 704 and 713 may be completely sealed, although this is not necessary.

The third housing 713 comprises two optically transmissive windows 714 and 715, as well as a mirror 716. The mirror may be such that it should also be protected against deleterious influences of e.g. certain gases or dust. Hence it may be advantageous to accommodate the mirror 716 in a housing, in this case the third housing 713. An example may be a mirror reflecting only a certain band of wavelengths, such as a dichroic mirror.

Reference numeral 717 represents an additional optical element, in this case in the form a moveable blind. The moveable blind 717 serves to impart final dimensions of the beam that exits the optical system shown. Since the moveable blinds need not comprise optically transparent materials, in fact often consist of opaque materials, there is often no need to accommodate this part in a protective environment. Furthermore, since the blinds 717 are moveable, they may require lubricant. The lubricant may be less desirable for sensitive optical parts, such as e.g. the moveable lens 711 or the mirror 716, and are hence preferably located outside chambers that comprise such sensitive elements.

Figure 8:
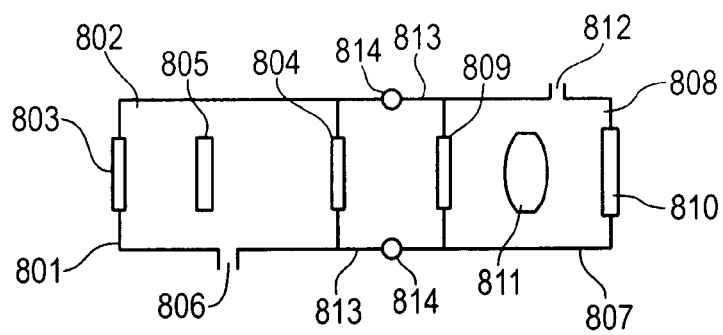
FIG. 8 shows another embodiment of a part of the optical system according to the invention.

FIG. 8 shows another embodiment of apart of the optical system according to the invention. In this and the following figure, any additional optical element is left out, for clarity 3 s sake. In FIG. 8, 801 denotes first housing, with a first chamber 802, a first optically transmissive window 803, a second optically transmissive window 804, a filter 805 and a first gas exchange opening 806. 807 denotes a second housing with a second chamber 808, a third optically transmissive window 809, a second optically transmissive window 810, a moveable lens 811 and a second gas exchange opening 812.

The first housing 801 and the second housing 807 are connected by means of connection walls 813 which are divisible by means of separator elements 814. The first housing 801 and the second housing 807 and all their elements correspond to similar elements in embodiments discussed above. Hence a discussion thereof is omitted here. One remark to be made here is that active gas exchange elements such as one or more pumps, which may be connected to gas exchange openings 806 and 812, are not shown here, although it is conceivable that these provide different atmospheres in first chamber 802 and the second chamber 808.

The first housing 801 and the second housing 807 are connected by means of connecting walls 813, which may be divided by means of separator means 814. Separator means 814 may be any means suitable for connecting parts of walls, such as screws and bolts, a magnetic closure, etc. An advantage of this embodiment is that separate housings may be provided, which may be connected to each other, thereby ensuring a correct positioning of an optical path through the housings 801 and 808, while yet the possibility exists of separating the houses. This gives the possibility of exchanging one housing, and thus of the one or more optical elements therein, independently from the one or more other housings. Note that, although only two housings are shown in this embodiment, any number of housings may be connected in this way.

Figure 9:
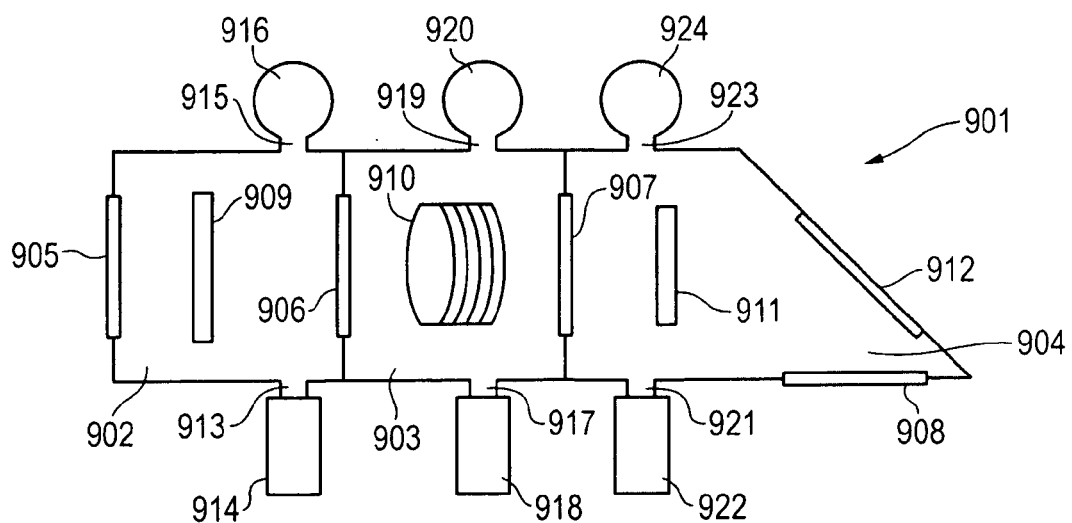
FIG. 9 shows yet another embodiment of a part of an optical system according to the invention.

FIG. 9 shows yet another embodiment of a part of an optical system according to the invention. Herein, 901 generally denotes a housing, having a first chamber 902, a second chamber 903 and a third chamber 904. A first, second, third and fourth optically transmissive window are denoted by reference numerals 905, 906, 907, and 908, respectively.

A filter is denoted by 909, a moveable lens by 910, a polarizer by 911 and a mirror by 912. First through sixth gas exchange openings are denoted by 913, 915, . . . , 923. First through third gas cylinders are denoted by 914, 918, 922, respectively, while first through third pumps are denoted by 916, 920, 924 respectively.

The housing 901 as shown comprises three chambers 902–904. These may also be called compartments. The chambers or compartments each comprise one or more optical elements, such as a filter, a moveable lens, a polarizer and a mirror. The chambers are optically and sealed connected via an optically transmissive window. For example, the first chamber 902 is optically connected to the second chamber 903 via optically transmissive window 906. In this case the window 906 has a double function, to wit as a window to the first chamber 902 as well as a window to the second chamber 903. The same holds for optically transmissive window 907. The number of chambers is in this case 3. It may however be any desired number, such as 2, 4 or more.

Although in the embodiment shown, every chamber has its own gas exchange means (gas cylinder and pump), this is not necessary. The gas exchange means of two or more chambers may be combined, while also one or more chambers may be completely sealed, or sealable by means of one or more valves etc. An advantage of the presence of separate gas exchange means for two or more chambers is that each such chamber may be provided with an appropriate atmosphere, such as a different gas, or a gas at a different pressure level. For example, the first chamber 902 may be purged with dry air, while the second chamber 903 maybe purged with nitrogen. Furthermore, again only exemplary, the third chamber may be kept at a high vacuum. The selection of the type of gas and/or gas pressure will be determined by the properties of the one or more optical elements in the chamber, which selection will offer no difficulty to the skilled person.

Whilst specific embodiments of the invention have been described above, it will be appreciated that the invention may be practiced otherwise than as described. As such, the description is not intended to limit the invention. The configuration, operation, and behavior of the present invention has been described with the understanding that modifications and variations of the embodiments are possible, given the level of detail present herein. Thus, the preceding detailed description is not meant or intended to, in any way, limit the invention 13 rather the scope of the invention is defined by the appended claims.

What is claimed is:

1. A lithographic optical system, comprising:
a first housing including a first chamber, a first optically transmissive window, a second optically transmissive window, at least one moveable lens positioned inside said first chamber, a linear electric motor and at least one gas bearing within the first chamber, the linear electric motor and the at least one gas bearing being configured to contactlessly move the moveable lens;
at least one gas exchange opening in communication with said first chamber; and
at least one additional optical element positioned outside said first housing,
wherein an optical path is defined by said first optically transmissive window, said second optically transmissive window, said at least one moveable lens, and said at least one additional optical element.

2. The lithographic optical system according to claim 1, constructed and arranged to receive radiation and convert said radiation into a beam of radiation for illuminating a patterning device.

3. The lithographic optical system according to claim 1, constructed and arranged to receive a patterned beam of radiation and project said patterned beam of radiation onto a substrate.

4. The lithographic optical system according to claim 1, wherein said at least one additional optical element comprises a blind, a filter, a mirror, or a lens.

5. The lithographic optical system according to claim 1, comprising a plurality of additional optical elements positioned outside of said first housing.

6. The lithographic optical system according to claim 1, wherein said moveable lens is a composite lens comprising a plurality of lens elements, at least one of which is moveable in the first chamber.

7. The lithographic optical system according to claim 1, wherein only said at least one moveable lens is a moveable part in said first chamber.

8. The lithographic optical system according to claim 1, wherein said at least one moveable lens is the only optical element in said first chamber.

9. The lithographic optical system according to claim 1, further comprising first gas exchange means connected to said at least one gas exchange opening.

10. The lithographic optical system according to claim 9, wherein said first gas exchange means comprises a pump, or a container with a gas, or both.

11. The lithographic optical system according to claim 1, wherein the at least one gas exchange opening is sealable.

12. The lithographic optical system according to claim 1, wherein the at least one gas exchange opening comprises a gas supply opening and a gas exhaust opening.

13. The lithographic optical system according to claim 1, wherein said moveable lens is coupled to a gravity compensator comprising a piston which is moveable in a cylinder with pressurizable gas.

14. The lithographic optical system according to claim 1, comprising at least one second housing, with a second chamber inside said second housing and with a third and fourth optically transmissive window and accommodating at least one of said at least one additional optical element in said second chamber.

15. The lithographic optical system according to claim 14, wherein said at least one second housing comprises at least one gas exchange opening in communication with said second chamber.

16. The lithographic optical system according to claim 15, wherein said at least one gas exchange opening is sealable.

17. The lithographic optical system according to claim 15, further comprising second gas exchange means connected to said gas exchange opening.

18. The lithographic optical system according to claim 14, wherein said first housing is releasably connected to at least one second housing.

19. The lithographic optical system according to claim 18, wherein one of said optically transmissive windows of said first housing and one of said optically transmissive windows of said at least one second housing form a common optically transmissive window.

20. The lithographic optical system according to claim 1, wherein said linear motor includes a magnet part and a conductor part, wherein said moveable lens is connected to said conductor part or said magnet part.

21. The lithographic optical system according to claim 20, wherein said moveable lens is connected to said magnet part provided in said first chamber, wherein the conductor part is provided outside the first housing.

22. The lithographic optical system according to claim 20, wherein said magnet part, or said conductor part, or both, is coated with an outgassing-prevention coating.

23. A lithographic optical system, comprising:
a first housing including a first chamber inside said first housing, a radiation source, a first optically transmissive window, at least one moveable lens in said first chamber, a linear electric motor and at least one gas bearing within the first chamber, the linear electric motor and the at least one gas bearing being configured to contactlessly move the moveable lens;
at least one gas exchange opening in communication with said first chamber; and
at least one additional optical element positioned outside said first housing, wherein an optical path is defined by said radiation source of radiation, said at least one moveable lens, said first optically transmissive window, and said at least one additional optical element.

24. The optical system according to claim 23, constructed and arranged to provide a beam of radiation for illuminating a patterning device.

25. A lithographic apparatus, comprising:
(a) a radiation system configured to provide a beam of radiation, said radiation system including:
(i) a first housing including a first chamber, a first optically transmissive window, a second optically transmissive window, and at least one moveable lens positioned inside said first chamber, and a linear electric motor and at least one gas bearing within the first chamber, the linear electric motor and the at least one gas bearing being configured to contactlessly move the moveable lens,
(ii) at least one gas exchange opening in communication with said first chamber, and
(iii) at least one additional optical element positioned outside said first housing, wherein an optical path is defined by said first optically transmissive window, said second optically transmissive window, said at least one moveable lens, and said at least one additional optical element;
(b) a support structure configured to support a patterning device that imparts a desired pattern onto said beam of radiation;
(c) a substrate holder configured to hold a substrate; and
(d) projection system configured to project said patterned beam onto a target portion of said substrate.

26. The lithographic apparatus according to claim 25, wherein, with respect to said optical path, said first housing and said at least one additional optical element are positioned on a same side of said support structure.

27. A lithographic apparatus, comprising:
(a) a radiation system configured to provide a beam of radiation, said radiation system including:
  (i) a first housing including a first chamber inside said first housing, a radiation source, a first optically transmissive window, at least one moveable lens in said first chamber, a linear electric motor and at least one gas bearing within the first chamber, the linear electric motor and the at least one gas bearing being configured to contactlessly move the moveable lens,
  (ii) at least one gas exchange opening in communication with said first chamber, and
  (iii) at least one additional optical element positioned outside said first housing, wherein an optical path is defined by said radiation source of radiation, said at least one moveable lens, said first optically transmissive window, and said at least one additional optical element;
(b) a support structure configured to support a patterning device that imparts a desired pattern onto said beam of radiation; (c) a substrate holder configured to hold a substrate; and (d) a projection system configured to project said patterned beam onto a target portion of said substrate.

28. The lithographic apparatus according to claim 27, wherein, with respect to said optical path, said first housing and said at least one additional optical element are positioned on a same side of said support structure.

29. A lithographic apparatus, comprising:
(a) a radiation system configured to provide a beam of radiation;
(b) a support structure configured to support a patterning device that imparts a desired pattern onto said beam of radiation;
(c) a substrate holder configured to hold a substrate; and
(d) a projection system configured to project said patterned beam onto a target portion of said substrate, said projection system comprising,
  (i) a first housing including a first chamber, a first optically transmissive window, a second optically transmissive window, at least one moveable lens positioned inside said first chamber, a linear electric motor and at least one gas bearing within the first chamber, the linear electric motor and the at least one gas bearing being configured to contactlessly move the moveable lens,
  (ii) at least one gas exchange opening in communication with said first chamber, and
  (iii) at least one additional optical element positioned outside said first housing,
wherein an optical path is defined by said first optically transmissive window, said second optically transmissive window, said at least one moveable lens, and said at least one additional optical element.

30. The lithographic projection apparatus according to claim 29, wherein said at least one additional optical element is positioned between said support structure and said substrate holder.

* * * * *